United States Patent
Sugamoto

(10) Patent No.: US 7,593,275 B2
(45) Date of Patent: Sep. 22, 2009

(54) SEMICONDUCTOR MEMORY DEVICE

(75) Inventor: Hiroyuki Sugamoto, Kasugai (JP)

(73) Assignee: Fujitsu Microelectronics Ltd., Tokyo (JP)

( * ) Notice: Subject to any disclaimer, the term of this patent is extended or adjusted under 35 U.S.C. 154(b) by 6 days.

(21) Appl. No.: 12/046,783

(22) Filed: Mar. 12, 2008

(65) Prior Publication Data

US 2008/0225612 A1    Sep. 18, 2008

(30) Foreign Application Priority Data

Mar. 15, 2007   (JP)   ............... 2007-066701

(51) Int. Cl.
G11C 7/02    (2006.01)
(52) U.S. Cl. .................. 365/210; 365/189.09
(58) Field of Classification Search ................ 365/210, 365/189.09, 189.08, 194
See application file for complete search history.

(56) References Cited

U.S. PATENT DOCUMENTS 6,392,957  B1    5/2002   Shubat et al.
6,611,465  B2 *  8/2003   Terzioglu et al. ............ 365/194
7,149,102  B2 * 12/2006   Ozawa .......................... 365/94
7,277,322  B2 * 10/2007   Hirabayashi ............ 365/185.09

FOREIGN PATENT DOCUMENTS

JP    2006-004476    1/2006

\* cited by examiner

*Primary Examiner*—Anh Phung
(74) *Attorney, Agent, or Firm*—Arent Fox LLP

(57) ABSTRACT

According to an aspect of one embodiment, it is provided that semiconductor memory device determining a data read time required to read data from a memory cell by an operation to read a replica cell to which a replica bit line having a load equivalent to a bit line to be connected to the memory cell and a replica word line are connected, the semiconductor memory device comprising: a write control signal generating unit that includes logic gates coupled in multi stages for receiving an input of a replica word line activating signal generated in response to a driving signal for driving the replica word line, the write control signal generating unit generating a write control signal to determine a data write time required to write data in the memory cell based on the replica word line activating signal.

7 Claims, 5 Drawing Sheets

STRUCTURE OF MEMORY CIRCUIT DIRECTED TO FIRST EMBODIMENT

FIG. 1 STRUCTURE OF MEMORY CIRCUIT DIRECTED TO FIRST EMBODIMENT

FIG. 2 STRUCTURE OF WRITE CONTROL SIGNAL GENERATING CIRCUIT PROVIDED FOR MEMORY CIRCUIT DIRECTED TO FIRST EMBODIMENT

TIME CHART SHOWING OPERATIONS OF
MEMORY CIRCUIT DIRECTED TO FIRST EMBODIMENT

GRAPH SHOWING CHANGES OF DATA READ TIME AND
DATA WRITE TIME WITH REFERENCE TO BIT LINE LENGTH

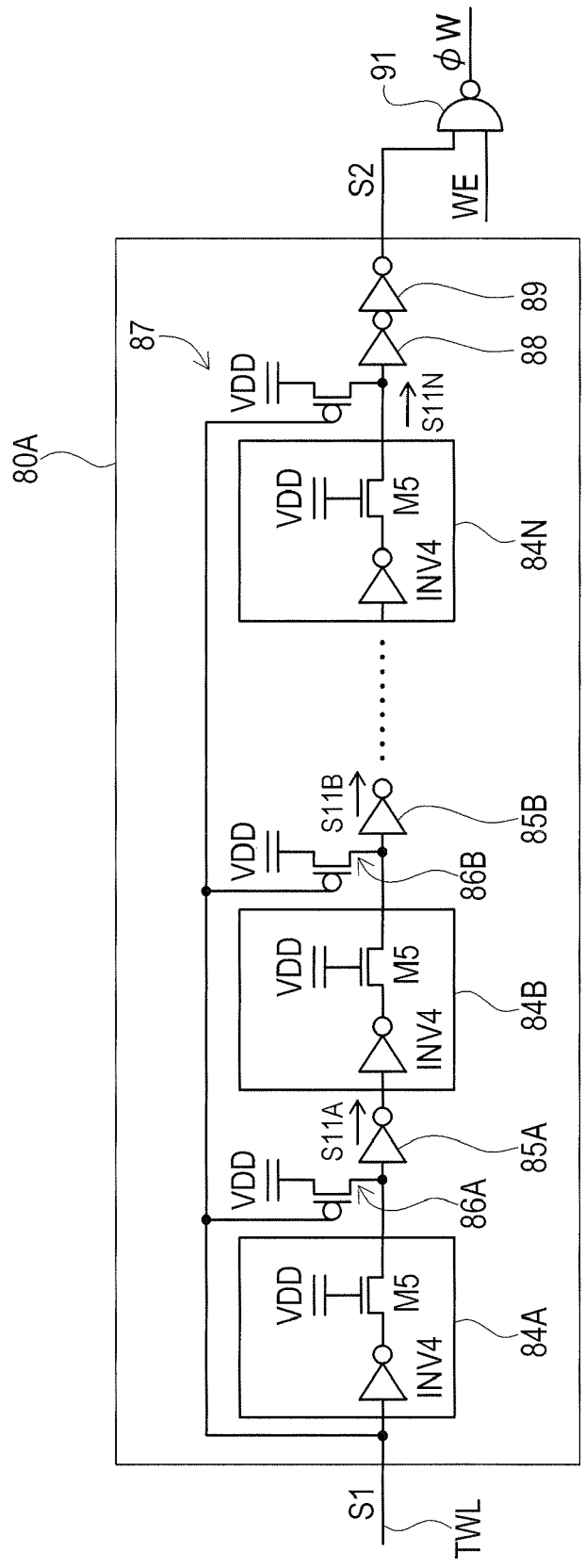
FIG. 5 STRUCTURE OF WRITE CONTROL SIGNAL GENERATING CIRCUIT PROVIDED FOR MEMORY CIRCUIT DIRECTED TO SECOND EMBODIMENT

SEMICONDUCTOR MEMORY DEVICE

CROSS-REFERENCE TO RELATED APPLICATIONS

This application is based upon and claims the benefit of priority from the prior Japanese Patent Application No. 2007-066701 filed on Mar. 15, 2007, the entire contents of which are incorporated herein by reference.

BACKGROUND

1. Field

This disclosure relates to semiconductor memory devices.

2. Description of Related Art

In a semiconductor memory device provided with SRAM (static random access memory) and the like, for example, a timing signal of a sense amplifier is generated to amplify read data from a memory cell, or data is written to generate a timing signal of a write amplifier.

When reading data from a memory cell in the above-mentioned semiconductor memory device, the time required to read data from the memory cell through the bit line is extended as the length of a bit line becomes longer.

When writing data in a memory cell, in contrast, the time required to write data in a memory cell is determined by the time required to finish writing data in the memory cell after applying write data to a bit line.

In the above mentioned semiconductor memory device, the time required to read data from a memory cell changes depending on a bit line length. Therefore, in case of a comparatively short bit line length, when the time to write data in a memory cell is set to be equal to the time to read data from a memory cell, it may become impossible to set sufficient write time to write data in a memory cell. Consequently, in order to optimally conduct data reading from a memory cell or data writing in a memory cell, data read time or data write time has to be set individually.

Japanese Laid-open Patent Publication No. 2006-4476 discloses a semiconductor memory device provided with: a first replica bit line consisting of wiring of the same wiring width and wiring interval as those of a bit line in a memory cell array and generating a read timing signal; and a second replica bit line comprising wiring of the same wiring width and wiring interval as those of a bit line and generating a write timing signal.

In the semiconductor memory device of Japanese Laid-open Patent Publication No. 2006-4476, the first replica bit line and the second replica bit line generate a read timing signal and a write timing signal respectively and control the serial operational timing of read and write, and enable the high-speed serial operation of read and write.

SUMMARY

According to an aspect of one embodiment, it is provided that semiconductor memory device determining a data read time required to read data from a memory cell by an operation to read a replica cell to which a replica bit line having a load equivalent to a bit line to be connected to the memory cell and a replica word line are connected, the semiconductor memory device comprising: a write control signal generating unit that includes logic gates coupled in multi stages for receiving an input of a replica word line activating signal generated in response to a driving signal for driving the replica word line, the write control signal generating unit generating a write control signal to determine a data write time required to write data in the memory cell based on the replica word line activating signal.

BRIEF DESCRIPTION OF THE DRAWINGS

FIG. 5 is a circuit configuration of a write control signal generating circuit provided for a memory circuit directed to a second embodiment.

DETAILED DESCRIPTION OF THE PREFERRED EMBODIMENTS

The semiconductor memory device includes the second replica bit line generating a write timing signal along with the first replica bit line generating read timing signal in order to set data write time. This makes it necessary to secure the space to place the second replica bit line in addition to the space to place the first replica bit line in the semiconductor memory device, adversely increasing the area of the semiconductor memory device.

The disclosure it is intended to provide a semiconductor memory device capable of securing sufficient time required to write data in a memory cell even in case of a short bit line length while decreasing the area.

The write control signal generating unit has logic gates being connected in multi stages and receiving an input of a replica word line activating signal generated in response to a driving signal to drive the replica word line, and generates a write control signal to determine a data write time required to write data in the memory cell based on the replica word line activating signal. Therefore, it is not necessary to provide a replica cell for writing or a replica bit line to be connected to the replica cell for writing in order to generate a write control signal. Consequently, it is not necessary to secure the area to place a replica cell for writing or a replica bit line to be connected to the replica cell for writing. Thereby, the area of the semiconductor memory device can be decreased.

When a write control signal generated by the write control signal generating unit determines a data write time, the data write time can be made longer compared with a data read time required to read data from a memory cell. Therefore, the time required to write data in a memory cell can be secured by making the data write time longer and the bit line length does not affect the data writing in a memory cell.

First Embodiment

Figure 1:
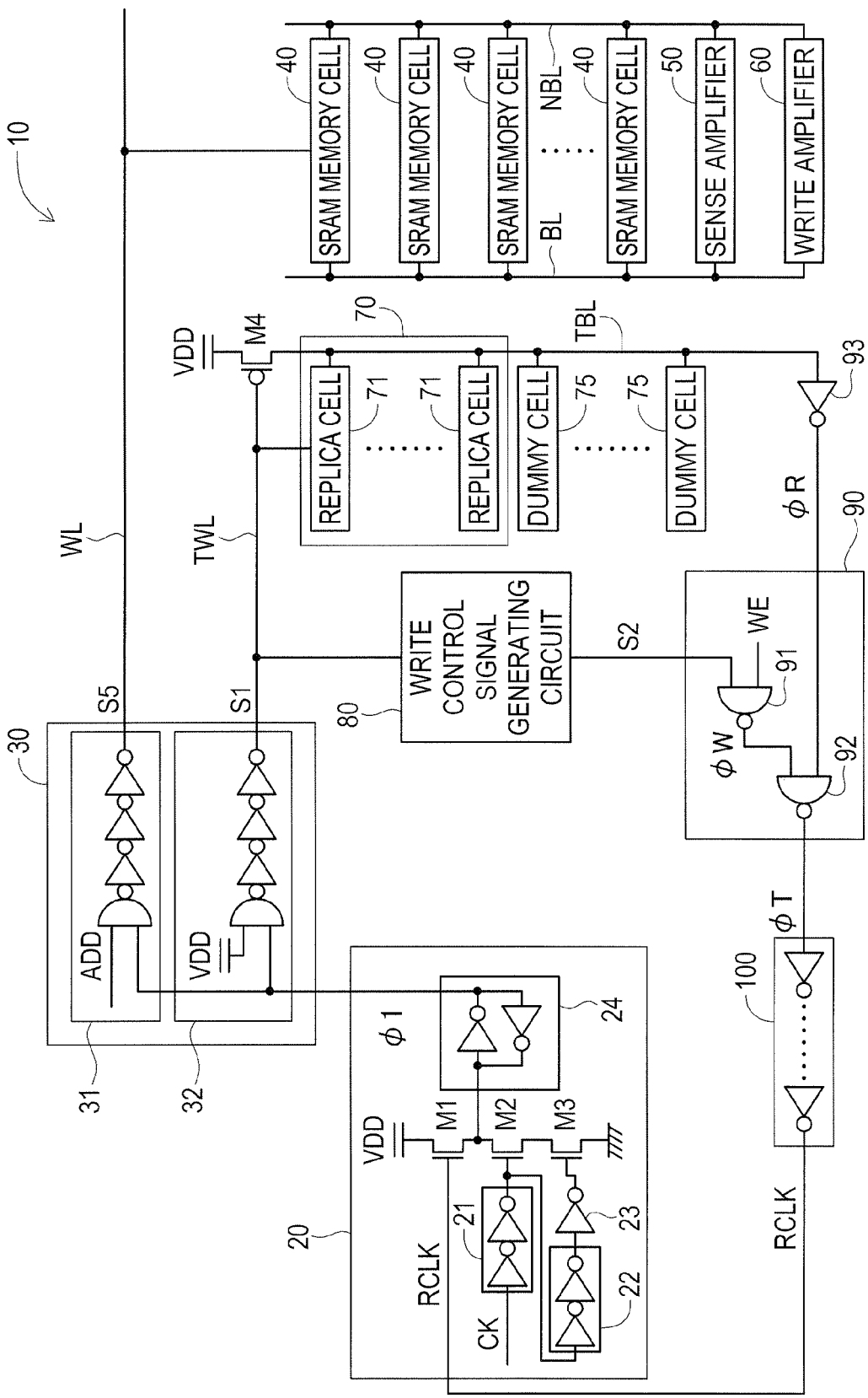
FIG. 1 is a circuit configuration diagram of a memory circuit directed to a first embodiment.

A first embodiment of the present disclosure will next be described with reference to FIG. 1 and FIG. 2. Here, the semiconductor memory device of the present disclosure will be described taking as example a memory circuit comprising SRAM. FIG. 1 is a diagram showing the structure of a memory circuit 10. The memory circuit 10 has a memory control circuit 20, a word line driver 30, SRAM memory cells 40, a sense amplifier 50, a write amplifier 60, a replica circuit 70, a write control signal generating circuit 80, a signal selection circuit 90 and a first delay adjustment circuit 100.

The memory control circuit 20 has a first delay circuit 21, a second delay circuit 22, an inverter 23, N-type transistors M1 through M3, and a latch circuit 24.

An output terminal of the first delay circuit 21 is connected to a gate of an N-type transistor M2 and an input terminal of a second delay circuit 22. An output terminal of the second delay circuit 22 is connected to an input of the inverter 23. An output of the inverter 23 is connected to a gate of the N-type transistor M3.

A contact point between a source of the N-type transistor M1 and a drain of the N-type transistor M2 is connected to an input terminal of the latch circuit 24.

A word line driver 30 comprises a first decoder circuit 31 and a second decoder circuit 32. A second input terminal of the first decoder circuit 31 is connected to an output terminal of the latch circuit 24. A first input terminal of a second decoder circuit 32 is connected to a power source voltage VDD. A second input terminal of the second decoder circuit 32 is connected to the output terminal of the latch circuit 24.

SRAM memory cells 40 are connected to an output terminal of the first decoder circuit 31 through a word line WL. The sense amplifier 50 is connected to each SRAM memory cell 40 through bit lines BL and NBL.

The write amplifier 60 is connected to each SRAM memory cell 40 through bit lines BL and NBL.

The replica circuit 70 comprises replica cells 71. The N-type transistors constituting the respective replica cells 71 have the same size as the N-type transistors constituting the SRAM memory cells 40. The respective replica cells 71 are connected to the output terminal of the second decoder circuit 32 through a replica word line TWL.

The respective replica cells 71 are connected to a replica bit line TBL. Dummy cells 75 are also connected to the replica bit line TBL. The replica word line TWL is connected to a gate of the P-type transistor M4. The replica bit line TBL is connected to a drain of a P-type transistor M4. A source of the P-type transistor M4 is connected to the power source voltage VDD.

Figure 2:
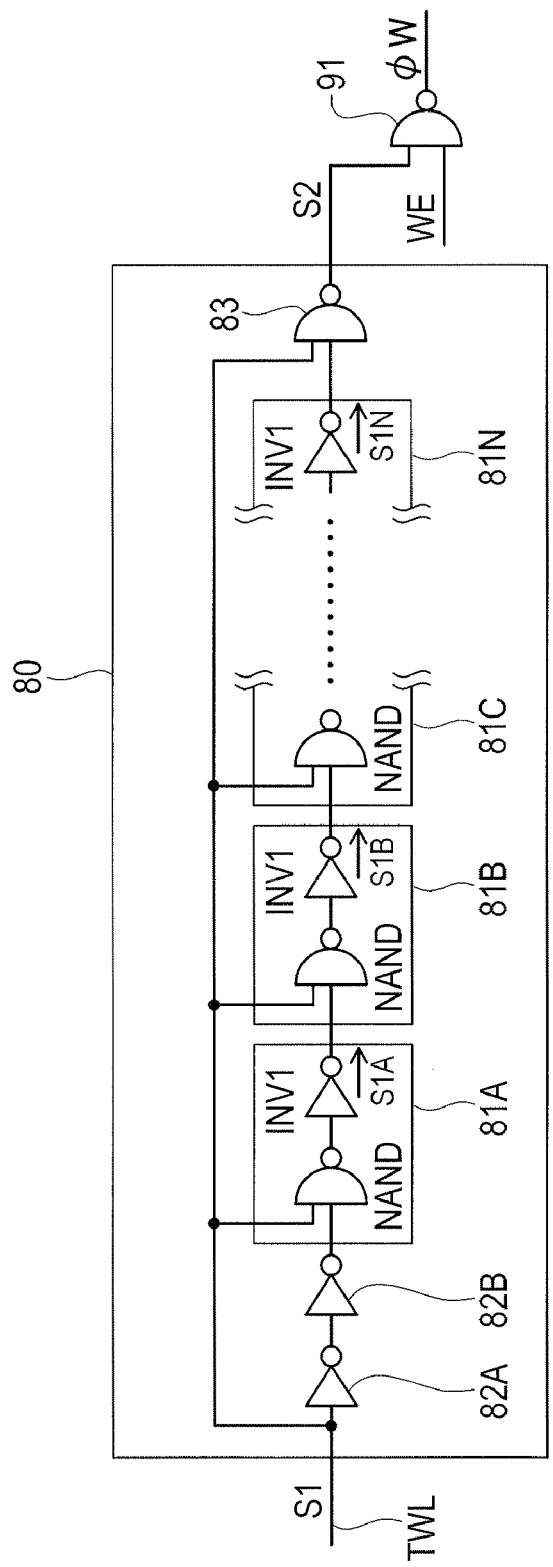
FIG. 2 is a circuit configuration diagram of a write control signal generating circuit provided for a memory circuit directed to the first embodiment.

As shown in FIG. 2, the write control signal generating circuit 80 comprises first signal generating units 81A through 81N, inverters 82, and a NAND gate circuit 83. The first signal generating units 81A through 81N, the inverters 82 and the NAND gate circuit 83 correspond to logical gates of the present disclosure, respectively.

Each first signal generating unit 81A through 81N comprises a NAND gate circuit NAND and an inverter INV1. A first input terminal of each NAND gate circuit NAND is respectively connected to a first input terminal of the first signal generating units 81A through 81N. A second input terminal of each NAND gate circuit NAND is respectively connected to a second input terminal of the first signal generating units 81A through 81N. An output terminal of each NAND gate circuit NAND is connected to an input of the inverter INV1. An output of the inverter INV1 is connected to an output terminal of each first signal generating unit 81A through 81N.

The replica word line TWL is connected to the first input terminal of each first signal generating unit 81A through 81N and a first input terminal of the NAND gate circuit 83. The replica word line TWL is connected to the second input terminal of the first signal generating unit 81A arranged at a first stage from amongst the first signal generating units 81A through 81N which are connected in multi-stage, through an inverter circuit 82A and an inverter circuit 82B. The output terminal of each first signal generating unit 81A through 81M is respectively connected to the second input terminal of the respective first signal generating units 81B through 81N arranged at the next stage. The output terminal of the first signal generating unit 81N arranged at the last stage is connected to a second input terminal of the NAND gate circuit 83. An output terminal of the NAND gate circuit 83 is connected to an output terminal of the write control signal generating circuit 80.

The signal selection circuit 90 comprises a first NAND gate circuit 91 and a second NAND gate circuit 92. A first input terminal of the first NAND gate circuit 91 is connected to the output terminal of the write control signal generating circuit 80 through a first input terminal of the signal selection circuit 90. The first input terminal of the second NAND gate circuit 92 is connected to the output terminal of the first NAND gate circuit 91. The second input terminal of the second NAND gate circuit 92 is connected to the replica bit line TBL through the second input terminal of the signal selection circuit 90 and an inverter 93. An output terminal of the second NAND gate circuit 92 is connected to an output terminal of the signal selection circuit 90.

The first delay adjustment circuit 100 comprises an odd number of inverters which are connected in multi-stage. An input terminal of the first delay adjustment circuit 100 is connected to the output terminal of the signal selection circuit 90. An output terminal of the first delay adjustment circuit 100 is connected to a gate of an N-type transistor M1 provided in the memory control circuit 20.

Figure 3:
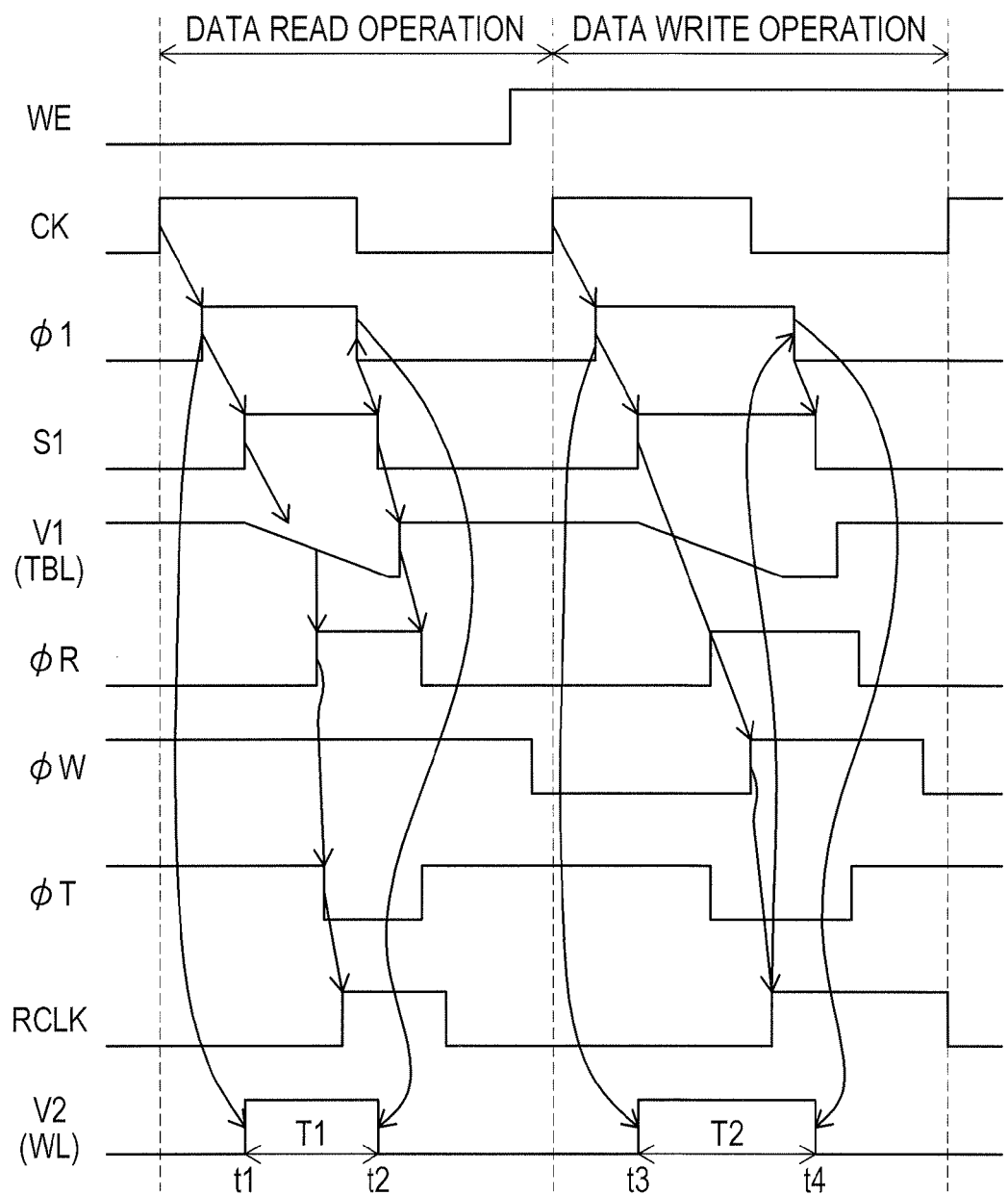
FIG. 3 is a time chart showing operations of a memory circuit directed to the first embodiment.

FIG. 3 is a timing chart showing operations of the memory circuit 10 directed to the present embodiment. The following operation are carried out in the memory circuit 10 at the time of a data read operation to read out data from the SRAM memory cells 40. As shown in FIG. 3, a clock signal CK is inputted to the first delay circuit 21 of the memory control circuit 20 from an oscillation circuit which is not shown. Upon receiving a high level clock signal CK, the first delay circuit 21 outputs a high level signal to the gate of the N-type transistor M2 and the second delay circuit 22. The high level signal inputted to the second delay circuit 22 is inverted by the inverter 23 to a low level signal. This low level signal is inputted to a gate of the N-type transistor M3.

At this time, a low level delay adjustment signal RCLK is inputted to a gate of the N-type transistor M1 of the memory control circuit 20. As a result, the N-type transistor M1 is turned off. The N-type transistor M2 is turned on upon receiving a high level signal at its gate. The N-type transistor M3 is turned off upon receiving a low level signal at its gate.

The latch circuit 24 receives a low level signal. If the signal received at the latch circuit 24 is maintained at a low level, the latch circuit 24 holds a high level signal. As shown in FIG. 3, the output signal Φ1 of the latch circuit 24 is maintained at a high level.

As shown in FIG. 1, the high level output signal Φ1 is inputted to the first decoder circuit 31 and the second decoder circuit 32 of the word driver 30. The second decoder circuit 32 outputs a high level replica word line driving signal S1 obtained by delaying the output signal Φ1 to the replica word line TWL. The high level replica word line driving signal S1 activates the replica word line TWL.

Upon receiving an address signal ADD at a signal input terminal thereof, the first decoder circuit 31 outputs a high level word line driving signal S5 to the word line WL. The high level word line driving signal S5 activates the word line WL. As a result, the voltage V2 of the word line WL rises as shown in FIG. 3.

After the word line WL has been activated, a driving signal of the sense amplifier 50 is inputted to the sense amplifier 50 from the memory control circuit 20. As a result, the sense amplifier 50 is activated and the data outputted to the bit line BL and NBL is amplified, whereby the data read time T1 starts from time t1 in FIG. 3. The amplified data is outputted from the output terminal of a memory circuit 10 not shown.

When a high level replica word line driving signal S1 is inputted to a gate of a P-type transistor M4 connected to the replica word line TWL, the P-type transistor M4 is turned off. As a result, the voltage V1 of the replica bit line TBL which is connected to a drain of the P-type transistor M4 that is turned off drops as the time passes, as shown in FIG. 3.

When the voltage V1 of the replica bit line TBL drops, the inverter 93 connected to the replica bit line TBL outputs a high level inversion signal ΦR to the second input terminal of the second NAND gate circuit 92 through the input terminal of the signal selection circuit 90.

During the data read out operation, a high level output signal ΦW is inputted to the first input terminal of the second NAND gate circuit 92 which comprises a signal selection circuit 90. The second NAND gate circuit 92 outputs a low level selection signal ΦT to the first delay adjustment circuit 100 through an output terminal of the signal selection circuit 90.

The first delay adjustment circuit 100 delays the selection signal ΦT and outputs a high level delay adjustment signal RCLK to a gate of the N-type transistor M1 of the memory control circuit 20.

When the high level delay adjustment signal RCLK is inputted to the gate of the N-type transistor M1 and a low level clock signal CK is inputted to the first delay circuit 21, the N-type transistor M1 is turned on, the N-type transistor M2 is turned off, and the N-type transistor M3 is turned on.

The latch circuit 24 receives a high level signal. As a result, the latch circuit 24 holds a low level signal. Here, the output signal Φ1 of the latch circuit 24 is inverted from a high level to a low level, as shown in FIG. 3.

The low level output signal Φ1 is inputted to the first decoder circuit 31 and the second decoder circuit 32 of the word driver 30. The second decoder circuit 32 outputs the low level replica word line driving signal S1 obtained by delaying the output signal Φ1 to the replica word line TWL. The low level replica word line driving signal S1 de-activates the replica word line TWL.

When the first decoder circuit 31 no longer receives an address signal ADD at its signal input terminal, it outputs a low level word line driving signal S5 to the word line WL. The low level word line driving signal S5 de-activates the word line WL. As a result, the voltage V2 of the word line WL drops. When the time fixed in accordance with the driving signal inputted to the sense amplifier 50 has lapsed, the data read time T1 ends at time t2 in FIG. 3.

On the other hand, the following operations are carried out in the memory circuit 10 at the time of a data write operation to write data to the SRAM memory cells 40. During the data write operation, a high level clock signal CK is inputted to the first delay circuit 21 of the memory circuit 20 from an oscillation circuit which is not shown, similarly with the data read operation described above. Then, the latch circuit 24 outputs a high level output signal Φ1 to the first decoder circuit 31 and the second decoder circuit 32, similarly with the data read operation. The output signal Φ1 corresponds to the driving signal of the present disclosure.

Next, similarly with the data read operation described above, the second decoder circuit 32 outputs the high level replica word line driving signal S1 to the replica word line TWL. As a result, the replica word line TWL is activated. The replica word line driving signal S1 corresponds to the replica word line activating signal of the present disclosure.

Upon receiving an address signal ADD corresponding to the word line WL to be selected at a signal input terminal thereof, the first decoder circuit 31 outputs a high level word driving signal S5 to the word line WL. As a result, the word line WL is activated, and the voltage V2 of the word line WL rises as shown in FIG. 3.

After the word line WL has been activated, a driving signal for the write amplifier 60 is inputted to the write amplifier 60 from the memory control circuit 20. The write amplifier 60 applies write data to the bit lines BL and NBL. The data write time T2 starts from time t3 in FIG. 3, and write data is written to the SRAM memory cells 40 connected to the selected word line WL.

In the data write operation, the data write time T2 is made longer than the data read time T1, as compared to the above-described data read operation, by delaying the time when the delay adjustment signal RCLK is inverted from a low level to a high level. In the present embodiment, the time when the delay adjustment signal RCLK is inverted from a low level to a high level is delayed as compared to the above-described data read operation, by carrying out an operation to be described hereinafter employing the write control signal generating circuit 80 and the signal selection circuit 90. In the present embodiment, the write control signal generating circuit 80 and the signal selection circuit 90 correspond to the write control signal generating unit of the present disclosure.

The first input terminal of the first NAND gate circuit 91 provided in the signal selection circuit 90 receives a low level inversion delay signal S2 obtained by delaying the replica word line driving signal S1. The inversion delay signal S2 is generated as will be next described.

As shown in FIG. 2, the high level replica word line driving signal S1 is maintained at a high level through the inverters 82A and 82B and is inputted to the second input terminal of the NAND gate circuit NAND provided in the first signal generating unit 81A. On the other hand, the first input terminal of the NAND gate circuit NAND receives the high level replica word line driving signal S1.

A NAND gate circuit of the first signal generating unit 81A outputs a low level signal to the inverter INV1. Inverter INV1 outputs a high level signal S1A to the second input terminal of the first signal generating unit 81B through the output terminal of the first signal generating unit 81A. The high level signal S1A corresponds to a first logical adjustment signal of the present disclosure. The inverter INV1 corresponds to a first inverter circuit of the present disclosure.

The first signal generating unit 81B outputs a high level signal S1B to the second input terminal of the first signal generating unit 81C through the output terminal of the first signal generating unit 81B, similar with the first signal generating unit 81A. The high level signal S1B corresponds to a first logical adjustment signal of the present disclosure.

Thereafter, each first signal generating unit 81C through 81N operates in a similar fashion as the first signal generating units 81A and 81B. The NAND gate circuit 83 receives a high level signal S1N at its second input terminal. The high level signal S1N corresponds to the first logical adjustment signal of the present disclosure.

Upon receiving a high level replica word line driving signal S1 at a first input terminal thereof, and a high level signal S1N at a second input terminal thereof, the NAND gate circuit 83 outputs a low level inversion delay signal S2 to the first input terminal of the first NAND gate circuit 91, through the output terminal of the write control signal generating circuit 80.

In the data write operation, a high level write enable signal WE is inputted to the second input terminal of the first NAND gate circuit 91, as shown in FIG. 3. As a result, as shown in FIG. 3, the first NAND gate circuit 91 outputs a high level output signal ΦW to the first input terminal of the second NAND gate circuit 92 after a high level output signal ΦR inputted to the second input terminal of the second NAND gate circuit 92. The output signal ΦW corresponds to the write control signal of the present disclosure.

Upon receiving a high level output signal ΦW at a first input terminal thereof and a high level output signal ΦR at a second input terminal thereof, the second NAND gate circuit 92 outputs a low level selection signal ΦT to the first delay adjustment circuit 100 through the output terminal of the signal selection circuit 90.

Similarly with the data read operation described above, the first delay adjustment circuit 100 outputs a high level delay adjustment signal RCLK to a gate of the N-type transistor M1 of the memory control circuit 20.

When a high level delay adjustment signal RCLK is inputted to the gate of the N-type channel transistor M1 and a low level clock signal CK is inputted to the first delay circuit 21, a high level signal is inputted to the latch circuit 24 similarly with the data read operation described above. As a result, as shown in FIG. 3, the output signal Φ1 of the latch circuit 24 is inverted from a high level to a low level.

Then, similarly with the data read operation described above, the second decoder circuit 32 outputs a low level replica word line driving signal S1 to a replica word line TWL. As a result, the replica word line TWL is de-activated.

When the output signal Φ1 of the latch circuit 24 which is inputted to the signal input terminal is changed from a high level to a low level, the first decoder circuit 31 outputs a low level word line driving signal S5 to the word line WL. The low level word line driving signal S5 de-activates the word line WL. As a result, the voltage V2 of the word line WL drops. At this time, after a time fixed in accordance with the driving signal inputted to the write amplifier 60 has lapsed, the write amplifier 60 is turned off at time t4 in FIG. 3, and the data write time T2 ends.

In the memory circuit 10 of the present embodiment, the write control signal generating circuit 80 generates an inversion delay signal S2 obtained by delaying the replica word line driving signal S1. Then, the signal selection circuit 90 delays the phase of the output signal ΦW which is the inversion logical AND result between the inversion delay signal S2 and the write enable signal WE and is employed to determine the data write time T2 more than the phase of the output signal ΦR employed to determine the data read time T1.

Figure 4:
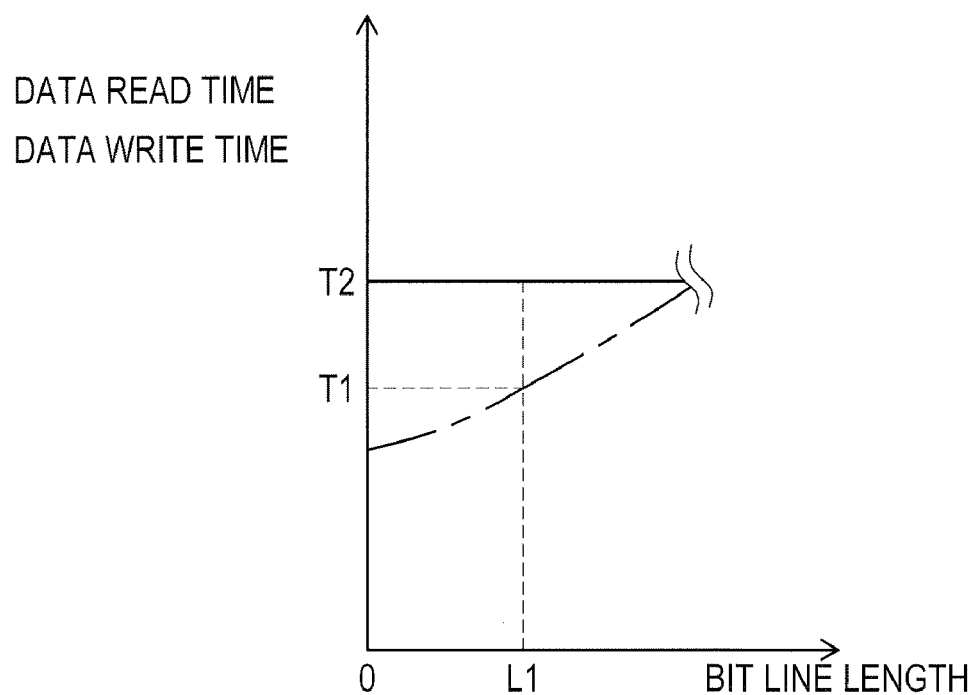
FIG. 4 is a graph showing changes of data read time and data write time with reference to bit line length.

In the memory circuit 10, the data write time T2 is ended in accordance with the timing at which the output signal ΦW whose phase has been delayed is switched from a low level to a high level. As shown in FIG. 4, the memory circuit 10 increases the set time for the data write time T2 in an area (for instance bit line length L1) in which the length of the bit lines BL and NBL is short, in accordance with the timing at which the output signal ΦR whose phase is more advanced than that of the output signal ΦW is switched from a low level to a high level, as compared to the set time for the data read time T1 in which the end time for the data read operation is fixed. Accordingly, increasing the set time for the data write time T2 in the memory circuit 10 as compared with the set time for the data read time T1 in an area (for instance, the bit line length L1) in which the length of the bit lines BL and NBL is short makes it possible to set a time which is sufficient for writing data to the SRAM memory cell 40. Since the driving capacity of the write amplifier 60 shown in FIG. 1 is sufficiently large, the data write time T2 becomes substantially constant, without being adversely influenced by the bit line length, as shown in FIG. 4. On the other hand, the load (SRAM memory cells 40, etc) connected to the bit lines BL and NBL increases as the bit line length becomes longer. Also, since amplification of the read data requires time, the data read time T1 increases as the bit line length becomes longer, as shown in FIG. 4.

In the memory circuit 10 of the present embodiment, the write control signal generating circuit 80 comprises inverters 82A and 82B which receive the replica word line driving signal S1 obtained by delaying a high level output signal Φ1, first signal generating units 81A through 81N and the NAND gate circuit 83. In the memory circuit 10, after an inversion delay signal S2 is generated in the write control signal generating circuit 80 by delaying the replica word line driving signal S1, the signal selection circuit 90 generates an output signal ΦW for use to determine the data write time T2. Thus, there is no need to provide replica cells for write purposes and replica bit lines connected to the replica cells for write purposes to generate an output signal ΦW in the memory circuit 10 of the present embodiment. Accordingly, according to the memory circuit 10 in the present embodiment, there is no need to ensure an area to arrange replica cells for write purposes and replica bit lines which are connected to the replica cells for write purposes, which makes it possible to suppress an increase in the area of the memory circuit.

In the memory circuit 10 of the present embodiment, when the data write time T2 is determined in accordance with the output signal ΦW, the data write time T2 can be increased in the area where the bit lines BL and NBL are short, as compared to the data read time T1, as shown in FIG. 4. According to the memory circuit 10 of the present embodiment, the data write time T2 can be increased thereby ensuring the time required to write data to the SRAM memory cells 40. This enables data writes to the SRAM memory 40 without being adversely influenced by the length of the bit lines BL and NBL.

In the memory circuit 10 of the present embodiment, the write control signal generating circuit 80 comprises NAND gate circuits NAND constituting each of the first signal generating units 81A through 81N. Each NAND gate circuit NAND receives a high level replica word line driving signal S1 at the first input terminal thereof, and high level signals S1A through S1M (signals S1C through S1M are not shown) at the second input terminal thereof. In the memory circuit 10 of the present embodiment, if the SRAM memory cell 40 to which data will be written is selected and the word line driving signal S5 becomes a high level and the replica word line driving signal S1 becomes a high level, the N-type transistors provided in the NAND gate circuits NAND of the first signal generating units 81A through 81N can form a circuit in which two N-type transistors are connected in two upper and lower stages, similarly with the case that the SRAM memory cells 40 drive the bit lines BL and NBL through a transfer gate. Thus, in the memory circuit 10 of the present embodiment, by forming a circuit in which two N-type transistors are connected in two upper and lower stages, the driving capacity of the NAND gate circuits NAND of the first signal generating units 81A through 81N can be approximated to the capacity at which the SRAM memory cells 40 drive the bit lines BL and NBL through the transfer gate. Accordingly, according to the memory circuit 10 of the present embodiment, the driving capacity of the NAND gate circuits NAND of the respective first signal generating units 81A through 81N and the capacity at which the SRAM memory cells 40 drive the bit lines BL and NBL through the transfer gate vary respectively in accordance with the operation characteristics of the N-type transistors, even if operating conditions such as variations of the manufacturing process, ambient temperature and power source voltage VDD change and the operation characteristics of the N-type transistors vary. The driving capacity of the NAND gate circuits NAND for the first signal generating units 81A through 81N provided in the write control signal generating circuit 80 can be made to follow the capacity at which the SRAM memory cells 40 drive the bit lines BL and NBL through the transfer gate, in accordance with a change in the operation characteristics.

In the memory circuit 10 of the present embodiment, if the word line driving signal S5 is at a high level and the replica word line driving signal S1 is at a high level when the first signal generating units 81A through 81N comprising NAND gate circuits NAND are connected in multi-stage, the N-type transistors provided in the NAND gate circuits NAND of the respective first signal generating units 81A through 81N which are connected in multi-stage can form a circuit in which two N-type transistors are connected in two upper and lower stages, similarly with the case that the SRAM memory cells 40 drive the bit lines BL and NBL through the transfer gate. In the memory circuit 10 of the present embodiment, the circuit formed by the respective NAND gate circuits is constituted in a similar fashion with the circuit in which the SRAM memory cells 40 drive the bit lines BL and NBL through the transfer gate, so that the driving capacity of the NAND gate circuits NAND can be approximated to the capacity at which the SRAM memory cells 40 drive the bit lines BL and NBL through the transfer gate, even if the first signal generating units comprising the NAND gate circuits NAND are connected in multi-stage in accordance with a desired data write time T2. Accordingly, according to the memory circuit 10 in the present embodiment, by approximating the driving capacity of the NAND gate circuits NAND to the capacity at which the SRAM memory cells 40 drive the bit lines BL and NBL through the transfer gate, the driving capacity of the NAND gate circuits NAND can be made to follow the capacity at which the SRAM memory cells 40 drive the bit lines BL and NBL through the transfer gate in accordance with a change in the operation characteristics of the N-type transistors, even in case the first signal generating units 81A through 81N comprising the NAND gate circuits NAND are connected in multi-stage.

In the memory circuit 10 of the present embodiment, the output terminals of the NAND gate circuits NAND provided in the first signal generating units 81A through 81M connected in multi-stage are respectively connected to the second input terminals of the NAND gate circuits NAND provided in the first signal generating units 81B through 81N through the respective inverters INV1. In the memory circuit 10 of the present embodiment, if each NAND gate circuit NAND provided in the first signal generating units 81B through 81N receives a high level replica word line driving signal S1 at its first input terminal, and high level signals S1A through S1M at its second input terminal (signals S1C through S1M are not shown), the low level output signals generated by each NAND gate circuit NAND can be inverted into high level signals S1A through S1M by the respective inverters INV1. Accordingly, according to the memory circuit 10 of the present disclosure, signals whose polarity has been reversed by the respective inverters INV1 can be turned into high level signals S1A through S1M having the same polarity as the high level replica word line driving signal S1. Here, in the memory circuit 10, high level signals S1A through S1M representing output signals of the respective inverters INV1 and having the same polarity as the high level replica word line driving signal S1 can be inputted to the second input terminal of each NAND gate circuit NAND to which the respective inverter INV1 has been connected.

Second Embodiment

A second embodiment of the present disclosure will now be described with reference to FIG. 5. A memory circuit of the present embodiment has a write control signal generating circuit 80A shown in FIG. 5, in place of the write control signal generating circuit 80 in the first embodiment. The write control signal generating circuit 80A has second signal generating units 84A through 84N and inverters 85A through 85M, and P-type transistors 86A through 86M. Here, the second signal generating units 84C through 84M, inverters 85C through 85M and P-type transistors 86C through 86M are not shown in the drawing.

The second signal generating units 84A through 84N respectively comprise an inverter INV4 and an N-type transistor M5. An input of each inverter INV4 is connected to an input terminal of each second signal generating unit 84A through 84N. An output of each inverter INV4 is connected to a source of each N-type transistor M5. A power source voltage VDD is applied to a gate of each N-type transistor M5. A drain of each N-type transistor M5 is connected to an output terminal of each second signal generating unit 84A through 84N. The N-type transistor M5 corresponds to an NMOS transistor of the present disclosure. The inverter INV4 corresponds to a second inverter circuit of the present disclosure. Further, each second signal generating unit 84A through 84N corresponds to a signal generating unit of the present disclosure.

The second signal generating unit 84A is connected to the second signal generating unit 84B through the P-type transistor 86A and the inverter 85A. The P-type transistor 86A corresponds to a PMOS transistor of the present disclosure. Also, the inverter 85A corresponds to a third inverter circuit of the present disclosure.

An output terminal of the second signal generating unit 84A is connected to an input of inverter 85A. An output of inverter 85A is connected to an input terminal of the second signal generating unit 84B. A drain of the P-type transistor 86A is connected to the input of inverter 85A. A source of the P-type transistor 86A is connected to a power source voltage VDD. A replica word line TWL is connected to an input terminal of the second signal generating unit 84A, to the gate of each P-type transistor 86A through 86M and the gate of the P-type transistor 87.

Similarly with the connection state between the second signal generating unit 84A and the second signal generating unit 84B, the second signal generating unit 84B is connected to the second signal generating unit 84C (not shown) through the PMOS transistor 86B and the inverter 85B. Similarly with the connection state between the second signal generating unit 84A and the second signal generating unit 84B, the second signal generating units 84C through 84N are connected in multi-stage. The PMOS transistor 86B corresponds to the PMOS transistor of the present disclosure. Also, inverter 85B corresponds to a third inverter circuit of the present disclosure.

The output terminal of the second signal generating unit 84N is connected to the output terminal of the write control signal generating circuit 80A through the inverter 88 and the inverter 89. A drain of a P-type transistor 87 is connected to an input of the inverter 88. A source of the P-type transistor 87 is connected to the power source voltage VDD. A gate of the P-type transistor 87 is connected to a replica word line TWL through an input terminal of the write control signal generating circuit 80A.

In the present embodiment, an inversion delay signal S2 to be inputted to a first input terminal of a first NAND gate circuit 91 provided with a signal selection circuit 90 is generated as will be next described. As shown in FIG. 5, a high level replica word line driving signal S1 is inputted to the second signal generating unit 84A.

The high level replica word line driving signal S1 fixes the gate voltage of the P-type transistor 86A to a high level. As a result, the P-type transistor 86A is turned off. The second signal generating unit 84A outputs a low level signal to inverter 85A. Inverter 85A outputs a high level signal S11A obtained by inverting a low level signal, to a second signal generating unit 84B. A high level signal S11A corresponds to a second logical adjustment signal of the present disclosure.

Similarly with the P-type transistor 86A, a gate voltage of the P-type transistor 86B is fixed to a high level, whereby the P-type transistor 86B is turned off. The second signal generating unit 84B outputs a low level signal to inverter 85B. Inverter 85B outputs a high level signal S11B to a second signal generating unit 84C (not shown). A high level signal S11B corresponds to a second logical adjustment signal of the present disclosure.

Thereafter, each second signal generating unit 84C through 84N operates in a similar fashion with the second signal generating units 84A and 84B. The P-type transistor 87 is turned off similarly with the P-type transistors 86A and 86B. The low level signal S11N outputted from the second signal generating unit 84N is converted to an inversion delay signal S2 through the inverters 88 and 89. The inversion delay signal S2 is inputted to the first input terminal of the first NAND gate circuit 91.

According to the memory circuit of the present embodiment, in each second signal generating unit 84B through 84N of the write control signal generating circuit 80A, an inverter INV4 is connected to a source of the N-type transistor M5 having a gate thereof connected to the power source voltage VDD. In turn, high level signals S11A through S11M having the same polarity as the high level replica word line driving signals S1 are inputted to inverter INV4. In the memory circuit of the present embodiment, if the word line driving signal S5 becomes a high level and the replica word line driving signal S1 is a high level, one N-type transistor provided in inverter INV4 and an N-type transistor M5 can form a circuit in which N-type transistors are connected in two stages, similarly with the case that the SRAM memory cell 40 drives the bit lines BL and NBL through the transfer gate. For this reason, in the respective second signal generating units 84A through 84N, if one N-type transistor provided in inverter INV4 and an N-type transistor M5 forms a circuit in which the N-type transistors are connected in two stages, a driving capacity of each second signal generating unit 84A through 84N can be approximated to the capacity at which the SRAM memory cells 40 drive the bit lines BL and NBL through the transfer gate, similarly with the case that the SRAM memory cells 40 drive the bit lines BL and NBL through the transfer gate. Accordingly, in the memory circuit of the present embodiment, the driving capacity of the respective second signal generating units 84A through 84N and the capacity at which the SRAM memory cells 40 drive the bit lines BL and NBL through the transfer gate vary respectively in accordance with a change in the operation characteristics of the N-type transistors. The driving capacity of each second signal generating units 84A through 84N can be made to follow the capacity at which the SRAM memory cells 40 drive the bit lines BL and NBL through the transfer gate, even if operating conditions such as variations of the manufacturing process, ambient temperature and power source voltage VDD vary and the operation characteristics of the N-type transistor vary.

As with the memory circuit of the present embodiment, if the word line driving signal S5 is at a high level and the replica word line driving signal S1 is at a high level when the second signal generating units 84A through 84N comprising the inverter INV4 and the N-type transistor M5 are connected in multi-stage, one N-type transistor provided in inverter INV4 and the N-type transistor M5 comprised in the second signal generating units 84A through 84N which are connected in multi-stage can form a circuit in which the N-type transistors are connected in two stages, similarly with the case that the SRAM memory cells 40 drive the bit lines BL and NBL through the transfer gate. In the memory circuit of the present embodiment, the second signal generating units 84A through 84N form a circuit in which the N-type transistors are connected in two stages in a similar fashion with the circuit in which the SRAM memory cells 40 drive the bit lines BL and NBL through the transfer gate, so that the driving capacity of the second signal generating units 84A through 84N can be approximated to the capacity at which the SRAM memory cells 40 drive the bit lines BL and NBL through the transfer gate, even if the second signal generating units are connected in multi-stage in accordance with a desired data write time T2. Accordingly, in the memory circuit of the present embodiment, by approximating the driving capacity of each second signal generating unit 84A through 84N to the capacity at which the SRAM memory cells 40 drive the bit lines BL and NBL through the transfer gate, the driving capacity of each second signal generating unit 84A through 84N can be made to follow the capacity at which the SRAM memory cell 40 drives the bit lines BL and NBL through the transfer gate in accordance with the variations in operation characteristics of the N-type transistors, even if the second signal generating units 84A through 84N comprising the inverter INV4 and the N-type transistor M5 are connected in multi-stage.

In the memory circuit of the present embodiment, if the word line driving signal S5 becomes a high level and the replica word line driving signal S1 is a high level, the gate of each P-type transistor 86A through 86M is fixed to a high level voltage by a high level replica word line driving signal S1, whereby each P-type transistor 86A through 86M is turned off. If each P-type transistor 86A through 86M is turned off, a low level signal is inputted to the input of inverters 85A through 85M connected with the P-type transistors 86A through 86M. Each inverter 85A through 85M outputs a high level signal obtained by inverting a low level input signal. In the memory circuit of the present embodiment, if each inverter 85A through 85M outputs a high level signal to each second signal generating unit 84B through 84N, one N-type transistor provided in the inverter INV4 and an N-type transistor M5 having a gate thereof connected to the power source voltage VDD can form a circuit in which two N-type transistors are connected in multi-stage.

The present disclosure is not limited to the above-described embodiments, and needless to say, various improvements and modifications thereof can be performed without departing from the scope of the present disclosure.

According to a semiconductor memory device of the present disclosure, a write control signal generating unit has logical gates connected in multi-stage to which replica word line activation signals which are generated in accordance with a driving signal for driving the replica word lines are inputted and is adopted to generate a write control signal for determining a data write time required to write data to memory cells based on the replica word line activation signals. According to the semiconductor memory device of the present disclosure, there is no need to provide replica cells for write purposes and replica bit lines connected to these replica cells for write purposes in order to generate the write control signal. Accordingly, according to the semiconductor memory device of the present disclosure, there is no need to ensure an area for arranging replica cells for write purposes and replica bit lines connected to the replica cells for write purposes, thereby making it possible to suppress an increase in the area of the semiconductor memory device.

According to the semiconductor memory device of the present disclosure, when the data write time is determined depending on the write control signal generated by the write control signal generating unit, the data write time can be increased as compared to the data read time required to read data from the memory cell. According to the semiconductor memory device of the present disclosure, the data write time can be increased, thereby ensuring the time required to write data to the memory cell. This makes it possible to write data to the memory without being adversely influenced by the bit line length.

What is claimed is:

1. A semiconductor memory device determining a data read time required to read data from a memory cell by an operation to read a replica cell to which a replica bit line having a load equivalent to a bit line to be connected to the memory cell and a replica word line are connected, the semiconductor memory device comprising:
    a write control signal generating unit that includes logic gates coupled in multi stages for receiving an input of a replica word line activating signal generated in response to a driving signal for driving the replica word line, the write control signal generating unit generating a write control signal to determine a data write time required to write data in the memory cell based on the replica word line activating signal.

2. The semiconductor memory device according to claim 1, wherein the write control signal generating unit includes a plurality of NAND circuits, in each of which a first input terminal receives an input of the replica word line activating signal and a second input terminal receives a first logic adjusting signal generated in response to the replica word line activating signal and having a same polarity as the replica word line activating signal.

3. The semiconductor memory device according to claim 2, wherein the plurality of the NAND circuits are connected in multi stages.

4. The semiconductor memory device according to claim 3, wherein an output terminal of one NAND circuit in the plurality of the NAND circuits connected in multi stages is connected through a first inverter circuit to a second input terminal of another NAND circuit, different from the one NAND circuit.

5. The semiconductor memory device according to claim 1, wherein the write control signal generating unit includes a plurality of signal generating units, each of which has an NMOS transistor with power supply voltage connected to a gate and has a second inverter circuit to be connected to a source of the NMOS transistor and to receive an input of a second logic adjusting signal generated in response to the replica word line activating signal and having a same polarity as the replica word line activating signal.

6. The semiconductor memory device according to claim 5, wherein the plurality of the signal generating units are connected in multi stages.

7. The semiconductor memory device according to claim 6,
    wherein a third inverter circuit is connected between a drain of the NMOS transistor provided for one signal generating unit in the plurality of signal generating units connected in multi stages and the second inverter circuit provided for another signal generating unit different from the one signal generating unit, and
    a PMOS transistor, in which a source is connected to power supply voltage and a gate is activated by the replica word line activating signal, is connected to an input of the third inverter circuit.

* * * * *